United States Patent
Feyh et al.

(10) Patent No.: US 10,717,645 B2
(45) Date of Patent: Jul. 21, 2020

(54) EXPOSED-DIE MOLD PACKAGE FOR A SENSOR AND METHOD FOR ENCAPSULATING A SENSOR THAT INTERACTS WITH THE ENVIRONMENT

(71) Applicants: Robert Bosch GmbH, Stuttgart (DE); Ando Feyh, Reutlingen (DE); Gary O'Brien, Palo Alto, CA (US)

(72) Inventors: Ando Feyh, Reutlingen (DE); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/535,687

(22) PCT Filed: Dec. 17, 2015

(86) PCT No.: PCT/US2015/066293
§ 371 (c)(1),
(2) Date: Jun. 14, 2017

(87) PCT Pub. No.: WO2016/100621
PCT Pub. Date: Jun. 23, 2016

(65) Prior Publication Data
US 2018/0273376 A1 Sep. 27, 2018

Related U.S. Application Data

(60) Provisional application No. 62/093,073, filed on Dec. 17, 2014.

(51) Int. Cl.
*H01L 31/02* (2006.01)
*H01L 27/146* (2006.01)
(Continued)

(52) U.S. Cl.
CPC ........ *B81C 1/00309* (2013.01); *B81B 7/0061* (2013.01); *G01L 19/0069* (2013.01);
(Continued)

(58) Field of Classification Search
CPC .................................................... H01L 21/566
See application file for complete search history.

(56) References Cited

U.S. PATENT DOCUMENTS

| | | |
|---|---|---|
| 2008/0079105 A1 | 4/2008 | Chang et al. |
| 2008/0157236 A1 | 7/2008 | Chen et al. |

(Continued)

FOREIGN PATENT DOCUMENTS

FR 2986902 A1 8/2013

OTHER PUBLICATIONS

Supplementary European Search Report corresponding to European Patent Application No. 15 87 1051 (10 pages).
(Continued)

*Primary Examiner* — Julio J Maldonado
*Assistant Examiner* — Omar F Mojaddedi
(74) *Attorney, Agent, or Firm* — Maginot, Moore & Beck LLP

(57) ABSTRACT

A method of encapsulating a sensor device includes providing at least one sensor device that has a sensor portion on a substrate. An exclusionary zone is formed above an upper surface of the sensor portion. An outer boundary is formed on or about the sensor device with the outer boundary encircling the exclusionary zone. A mold material is deposited into a volume defined in part by the sensor device, the exclusionary zone, and the outer boundary to encapsulate portions of the sensor device. The exclusionary zone in one embodiment is an inner boundary that is formed on the sensor portion. The inner boundary encircles a portion of the upper surface of the sensor portion. The exclusionary zone in another embodiment is a selectively removable material deposited on the upper surface of the sensor portion. The selectively removable material occupies a space above a portion of the upper surface.

14 Claims, 8 Drawing Sheets

(51) Int. Cl.
    *H01L 21/56*      (2006.01)
    *B81C 1/00*      (2006.01)
    *H01L 23/28*      (2006.01)
    *H01L 23/31*      (2006.01)
    *H01L 23/24*      (2006.01)
    *G01L 19/14*      (2006.01)
    *G01L 19/00*      (2006.01)
    *B81B 7/00*      (2006.01)

(52) U.S. Cl.
    CPC ............ *G01L 19/147* (2013.01); *H01L 23/24* (2013.01); *H01L 23/28* (2013.01); *H01L 23/3185* (2013.01); *B81B 2201/0214* (2013.01); *B81B 2201/0264* (2013.01); *B81B 2207/012* (2013.01); *B81C 2203/0792* (2013.01); *H01L 2224/05554* (2013.01); *H01L 2224/32145* (2013.01); *H01L 2224/48091* (2013.01); *H01L 2224/48145* (2013.01); *H01L 2224/48227* (2013.01); *H01L 2224/48465* (2013.01); *H01L 2224/73265* (2013.01); *H01L 2224/8592* (2013.01); *H01L 2924/0002* (2013.01); *H01L 2924/1433* (2013.01); *H01L 2924/181* (2013.01); *H01L 2924/1815* (2013.01); *H01L 2924/19107* (2013.01)

(56) References Cited

U.S. PATENT DOCUMENTS

| | | | |
|---|---|---|---|
| 2009/0046183 A1 | 2/2009 | Nishida et al. | |
| 2009/0224344 A1 | 9/2009 | Huang et al. | |
| 2009/0256222 A1* | 10/2009 | Hsu | H01L 27/14618 257/432 |
| 2011/0024861 A1* | 2/2011 | Tu | H01L 27/14618 257/434 |
| 2011/0156188 A1 | 6/2011 | Tu et al. | |
| 2016/0141320 A1* | 5/2016 | Tu | H01L 27/14618 257/432 |
| 2016/0260761 A1* | 9/2016 | Jun | H01L 27/14618 |

OTHER PUBLICATIONS

International Search Report corresponding to PCT Application No. PCT/US2015/066293, dated Apr. 5, 2016 (3 pages).

* cited by examiner

EXPOSED-DIE MOLD PACKAGE FOR A SENSOR AND METHOD FOR ENCAPSULATING A SENSOR THAT INTERACTS WITH THE ENVIRONMENT

This application is a 35 U.S.C. § 371 National Stage Application of PCT/US2015/066293, filed on Dec. 17, 2015, which claims the benefit of priority to U.S. Provisional Application No. 62/093,073, filed Dec. 17, 2014, the disclosures of which are incorporated herein by reference in their entirety.

TECHNICAL FIELD

The disclosure relates to an electronic device with a mold package and more particularly to a semiconductor device with an exposed-die mold package.

BACKGROUND

Electronic devices, including semiconductor chips, are typically covered by or encapsulated within a sensor package to protect the electronic devices from undesirable conditions. Such undesirable conditions include light, heat, humidity, dust, and physical shock. In many sensor applications, the sensors directly interact with the environment being sensed and therefore require direct access to the sensed environment. Such sensors include gas-sensors, pressure sensors, bio-sensors, finger-print sensors, and humidity sensors. For these types of sensors, an "exposed-die package" is used which provides a packaging configuration which does not cover a predetermined area of the sensor and which includes the structure of the sensor providing the sensing function.

One common exposed-die package for sensors that require direct access to the sensed environment is a metal can package. Metal can packages provide access to the sensing area of the sensor and protect the sensor components, such as the silicon substrate and the bond wires, from mechanical impact. However, the use of metal can packages on some sensors results in a large packaging footprint since the can portion of the metal can package is typically glued to a seal-ring area of the sensor substrate. In addition, metal can packages often require a large height from the sensor substrate to provide sufficient clearance to the bond wires to prevent shorting therebetween. The fabrication and the assembly of the metal cap packages are also relatively costly compared to other packaging methods.

Mold packages are another type of packaging widely used in sensor applications and application specific integrated circuit (ASIC) and integrated circuit (IC) packaging since the mold packages provide a low cost package suited for high volume applications. Most mold packaging includes the use of a black plastic material, typically including epoxy molding compounds. One drawback of mold packages, however, is that it is sometimes difficult to keep the sensing area clear of mold material during the formation of the mold package.

Consequently, there is a need for an exposed-die mold package for sensors that is free of mold material in the sensing area of the sensors. A method of forming an exposed-died mold package for such sensors is also desirable.

SUMMARY

A method of encapsulating a sensor device in one embodiment includes providing a first sensor on a substrate, the first sensor having a first upper surface including a first sensor area, depositing a first dam on the first upper surface thereby forming a first exclusionary zone including the first sensor area, depositing first mold material onto the first upper surface about the first exclusionary zone, and encapsulating the first sensor with the deposited first mold material.

In some embodiments, the method includes removing the deposited first dam after encapsulating the first sensor, forming a second dam spaced apart from and encircling the first dam, depositing first mold material includes depositing first mold material within a space between the first dam and the second dam, providing a second sensor on the substrate, the second sensor having a second upper surface including a second sensor area, depositing a second dam on the second upper surface thereby forming a second exclusionary zone including the second sensor area, depositing second mold material onto the second upper surface about the second exclusionary zone, and encapsulating the second sensor device with the deposited second mold material.

In some embodiments, the method includes forming a third dam spaced apart from and encircling the first dam, depositing first mold material includes depositing first mold material within a space between the first dam and the third dam, forming the third dam spaced apart from and encircling the first dam includes forming the third dam spaced apart from and encircling the second dam, depositing the first dam includes depositing the first dam such that the first dam encircles a portion of the first upper surface including the first sensor area, depositing the first dam further includes pressing an insert on the first sensor, depositing the first dam further includes depositing a bead of material on the first sensor, the first sensor includes at least one bond wire electrically connecting the first sensor to the substrate, and the first dam is deposited such that the at least one bond wire is encapsulated by the deposited first mold material.

In some embodiments, depositing first mold material includes depositing a polymer compound having a first liquid or semi-liquid state, and encapsulating the first sensor with the deposited first mold material comprises encapsulating the first sensor with the deposited polymer compound having a second semi-solid or solid state, the first sensor is one or more of a pressure sensor, a gas sensor, a bio sensor, a medical sensor, a chemical sensor, and a radiation sensor, providing a first sensor on a substrate comprises providing an application specific integrated circuit (ASIC) and a first sensor on a substrate, the ASIC operatively connected to the first sensor via at least one bond wire, and encapsulating the first sensor with the deposited first mold material comprises encapsulating the ASIC, the at least one bond wire, and the first sensor with the deposited first mold material.

A sensor device in one embodiment includes a substrate, a sensor portion on the substrate, the sensor portion having an upper surface, a dam positioned on one or more of the substrate and the sensor portion, and a volume of mold material encapsulating portions of the substrate and sensor portion, the dam configured to define an opening in the mold material thereby exposing a portion of the upper surface of the sensor portion.

In some embodiments, the dam encircles the portion of the upper surface exposed through the mold material to define the opening, the dam is an insert positioned on the sensor portion, the dam is a bead of material positioned on the sensor portion, at least one bond wire electrically connecting the sensor portion to the substrate, the at least one bond wire encapsulated by the mold material.

A method of encapsulating a plurality of sensor devices in one embodiment includes providing a first sensor on a substrate, the first sensor having a first upper surface including a first sensor area, providing a second sensor on the substrate, the second sensor having a second upper surface including a second sensor area, depositing a first dam on the first upper surface thereby forming a first exclusionary zone including the first sensor area, depositing a second dam on the second upper surface thereby forming a second exclusionary zone including the second sensor area, depositing mold material onto (i) the first upper surface about the first exclusionary zone and (ii) the second upper surface about the second exclusionary zone, and encapsulating the first sensor and the second sensor with the deposited mold material. In some embodiments, the method includes singulating the encapsulated first and second sensors such that the first sensor is associated with a singulated first portion of the substrate and the second sensor is associated with a singulated second portion of the substrate.

DESCRIPTION

Figure 1:
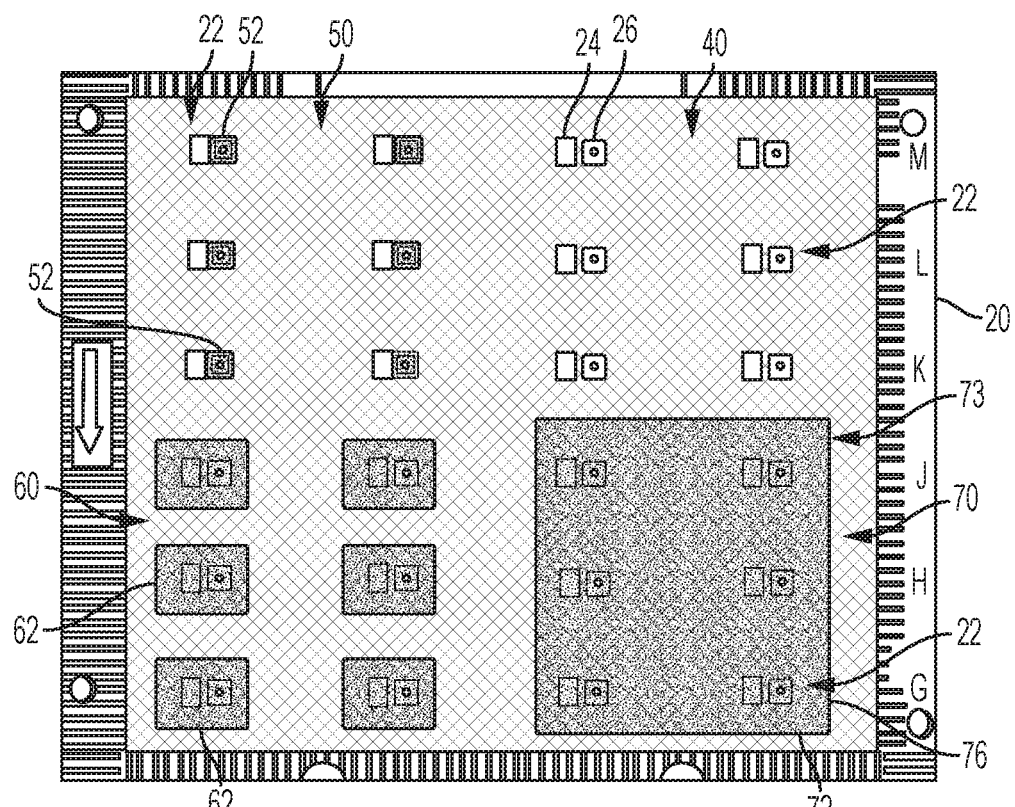
FIG. 1 is an image of an electronic substrate including a plurality of electronic chip pairs with respective groups of the chip pairs encapsulated by different mold package variants.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

FIG. 1 depicts a magnified image of an electronic substrate 20 that includes a plurality of electronic chip pairs 22 positioned in rows and columns across the substrate 20. The chip pairs 22 in the embodiment shown are substantially identical and each pair 22 includes an application specific integrated circuit (ASIC) 24 and a pressure sensor 26. In other embodiments, the chip pairs can include different components or can be grouped in numbers of less than or greater than two.

For purposes of this disclosure, reference to specific chip pair positions on the substrate 20 shown in FIG. 1 will be made with column number and row number designations starting with column 1 from left to right in the figure and starting with row 1 from top to bottom in the figure. For example chip position 1:1 refers to the upper-left-most chip pair and chip position 4:6 refers to the lower-right-most chip pair as viewed in FIG. 1.

Figure 2:
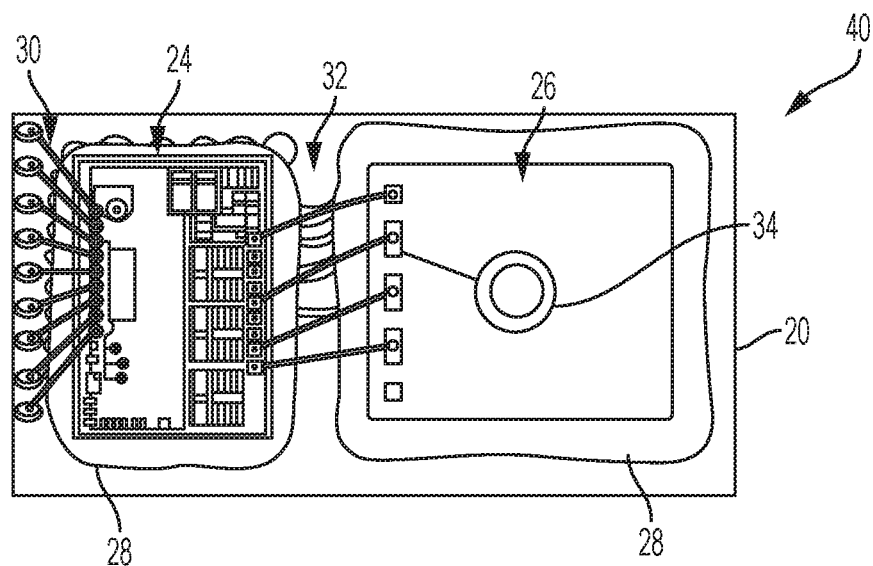
FIG. 2 is a magnified image of one of the chip pairs of FIG. 1 showing a wired connection of an ASIC to the substrate, a wired connection of the ASIC to a pressure sensor, and an exposed sensor of the pressure sensor.

FIG. 2 shows a magnified view of one of the plurality of chip pairs 22. The ASIC 24 is bonded to the substrate 20 with an adhesive 28 or similar bonding agent. A first plurality of wired connectors 30 electrically connects the ASIC 24 to the substrate 20. The pressure sensor 26 is also bonded to the substrate with an adhesive 28 or similar bonding agent. A second plurality of wired connectors 32 electrically connects the ASIC 24 to the pressure sensor 26. The pressure sensor includes at least one exposed sensor area 34 that is configured to directly interact with the environment to sense a condition of the environment.

Referring to FIGS. 1 and 2, the plurality of chip pairs 22 on the substrate 20 includes exposed chip pairs 40 in chip positions 3:1 through 3:3 and 4:1 through 4:3. The exposed chip pairs 40 are shown in an unpackaged state with the unbonded surfaces of the ASIC 24 and the pressure sensor 26 directly exposed to the environment. As discussed in more detail below, the remaining chip pairs are shown with exposed-die mold packages that in some embodiments locally cover one or both of the ASIC and the pressure sensor within a chip pair and in other embodiments cover multiple chip pairs within a region of the substrate.

Figure 3:
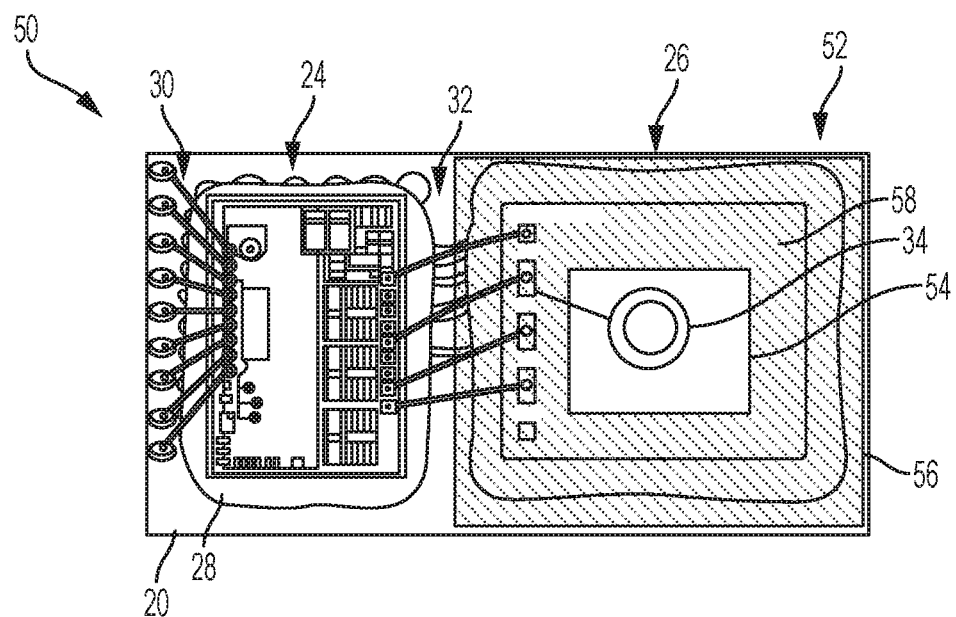
FIG. 3 depicts the chip pair of FIG. 2 with an inner dam surrounding the exposed sensor, an outer dam surrounding the pressure sensor, and a mold material encapsulating the pressure sensor between the inner and the outer dams.

Referring to FIGS. 1 and 3, the plurality of chip pairs 22 further includes first chip pairs 50 in chip positions 1:1 through 1:3 and 2:1 through 2:3. The first chip pairs 50 are each shown with a portion of the pressure sensor 26 encapsulated within respective first mold packages 52. With particular reference to FIG. 3, the first mold package 52 includes a first inner dam portion 54 surrounding the exposed sensor area 34, a second outer dam portion 56 surrounding the pressure sensor 26, and a first mold material 58 encapsulating the pressure sensor 26 between the inner and the outer dam portions 54, 56. The first inner dam portion 54 forms a boundary around the exposed sensor area 34 and prevents the first mold material 58 from obstructing both the exposed sensor area 34 and a portion of the sensor surface adjacent to the exposed sensor area 34. The first mold package 52 also encapsulates a portion of the second wired connectors 32 within the first mold material 58. As used herein, the terms "encapsulate", "encapsulated", and "encapsulating" when used with reference to an object mean that a material covers at least a portion of the object so as to protect that covered portion of the object from undesirable conditions, such as light, heat, humidity, dust, chemicals, and physical shock. In some embodiments, an object may have some portions that are encapsulated and other portions that are not encapsulated, while in other embodiments the entire object is encapsulated.

Figure 4:
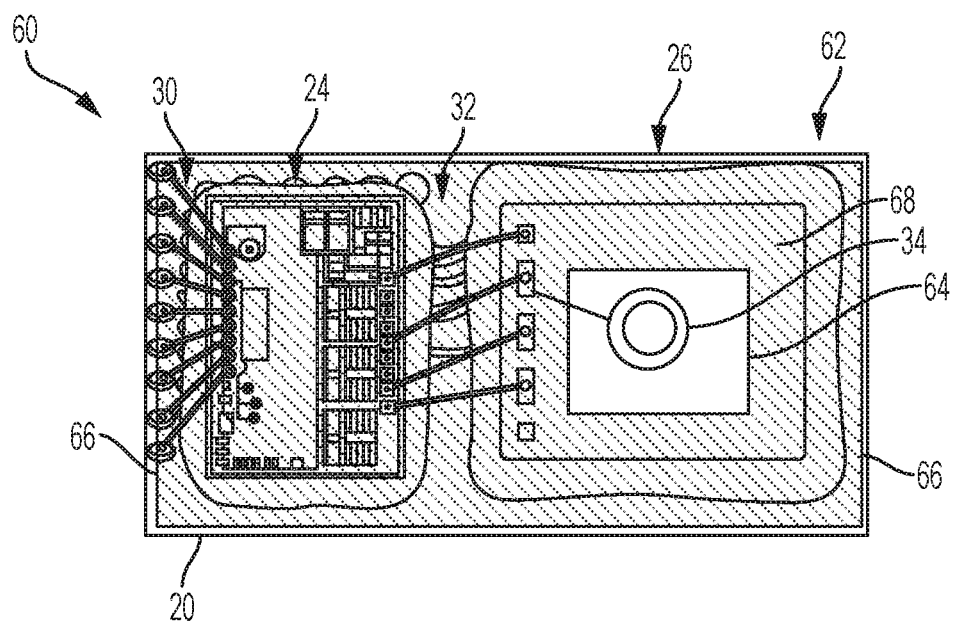
FIG. 4 shows the chip pair of FIG. 2 with an inner dam surrounding the exposed sensor, an outer dam surrounding the ASIC and the pressure sensor, and a mold material encapsulating the ASIC and the pressure sensor between the inner and the outer dams.

Referring now to FIGS. 1 and 4, the plurality of chip pairs 22 further includes second chip pairs 60 in chip positions 1:4 through 1:6 and 2:4 through 2:6. The second chip pairs 60 are each shown with the ASIC 24 and a portion of the pressure sensor 26 encapsulated within respective second mold packages 62. With particular reference to FIG. 4, the second mold package 62 includes a second inner dam portion 64 surrounding the exposed sensor area 34, a second outer dam portion 66 surrounding the ASIC 24 and the pressure sensor 26, and a second mold material 68 encapsulating the ASIC 24 and the pressure sensor 26 between the inner and the outer dam portions 64, 66. Similar to the first inner dam portion 54 of FIG. 3, the second inner dam portion 64 forms a boundary around the exposed sensor area 34 and prevents the second mold material 68 from obstructing both the exposed sensor area 34 and a portion of the sensor surface adjacent to the exposed sensor area 34. The second mold package 62 also encapsulates the first and the second wired connectors 30, 32.

Figure 5:
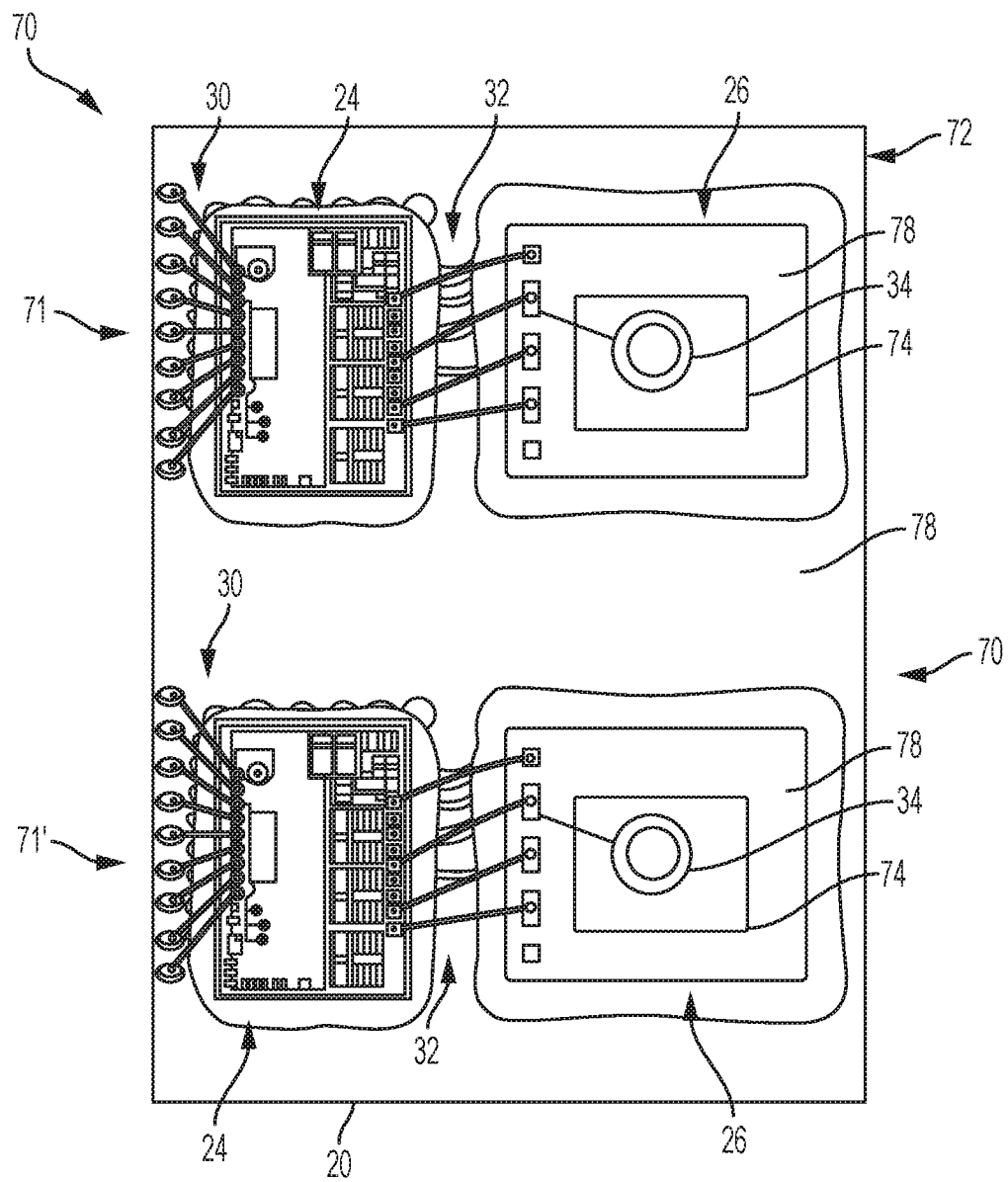
FIG. 5 shows two adjacent chip pairs similar to the chip pair of FIG. 2 with an inner dam surround the exposed sensor of the respective pressure sensors and a mold material encapsulating the ASIC's and the pressure sensors between the inner dams and an outer dam surrounding the adjacent chip pairs.

Referring now to FIGS. 1 and 5, the plurality of chip pairs 22 further includes third chip pairs 70 in chip positions 3:3 through 3:6 and 4:3 through 4:6. The third chip pairs 70 are shown substantially encapsulated within a third mold package 72 that covers all of the third chip pairs 70 located within an encapsulation area 73 of the substrate 20. With particular reference to FIG. 5, a first one 71 and a second one 71' of the third chip pairs 70 are shown positioned adjacent to one another on the substrate 20 within the encapsulation area 73. The third mold package 72 includes an inner dam portion 74 that surrounds the exposed sensor area 34 of each of the pressure sensors 26 of the third chip pairs 70 (FIG. 5) and a third outer dam portion 76 that surrounds all of the third chip pairs 70 and defines the encapsulation area 73 (FIG. 1). The third mold package 72 further includes a third mold material 78 that encapsulates the ASIC's 24 and the portions of the pressures sensors between the inner and the outer dam portions 74, 76. Similar to the first and the second inner dam portions 54, 64 of FIGS. 3 and 4, respectively, the third inner dam portion 74 forms a boundary around the exposed sensor area 34 of each of the pressure sensors 26 within the encapsulation area 73 and prevents the third mold material 78 from obstructing the exposed sensor area 34. The third mold package 72 also encapsulates all of the first and the second wired connectors 30, 32 within the encapsulation area 73.

Figure 6:
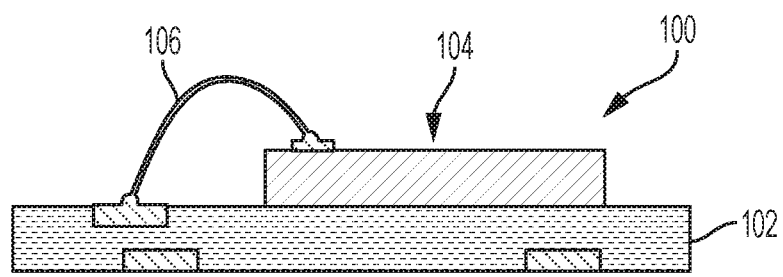
FIGS. 6-9 depict a first embodiment of a process for forming the mold package variants of FIGS. 1-5.

Referring now to FIGS. 6-9, a process for encapsulating a sensor device that interacts with the environment is depicted according to a first embodiment. Referring initially to FIG. 6, a sensor device 100 is provided on a substrate 102. In the embodiment shown, the sensor device 100 includes at least one exposed sensor area 104 formed in a silicon substrate of the device 100. The exposed sensor area 104 is configured to directly interact with the environment to sense a condition of the environment. In some embodiments, the sensor device is a pressure sensor that senses a pressure of the environment with the exposed sensor area. In other embodiments, the sensor device is one or more of a gas sensor, a bio sensor, a medical sensor, a chemical sensor, and a radiation sensor. In the embodiment shown, at least one bond wire 106 forms an electrical connection between the sensor device 100 and the substrate 102. In some embodiments, the sensor device includes a plurality of bond wires that electrically connect the sensor device to the substrate and/or to other electronic components.

Figure 7:
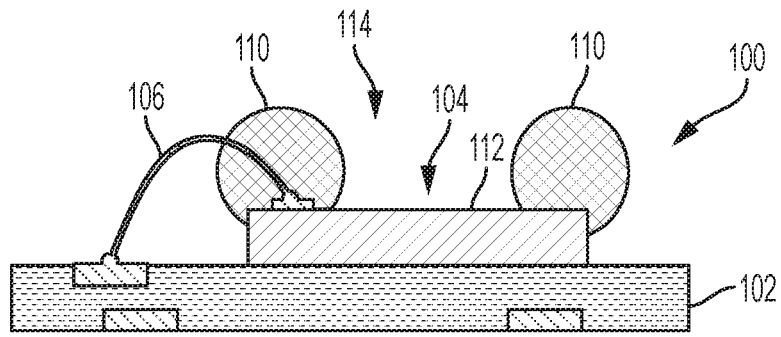

FIG. 7 shows an inner dam 110 positioned circumferentially about the exposed sensor area 104. The inner dam 110 is positioned on the sensor device 100 in a manner that forms an exclusionary zone above the exposed sensor area 104 within one or more walls of the inner dam 110. The walls of the inner dam 110 extend from an upper surface 112 of the sensor device 100 to a predetermined height above the sensor device 100. The exclusionary zone defined by the inner dam 110 forms an opening 114 to the exposed sensor area 104 within the one or more walls of the inner dam 110.

The opening 114 in some embodiments is circular and ranges in size from between 10 μm to 1000 μm in diameter.

The inner dam 110 in some embodiments is an insert that is pressed on the sensor device 100 to form the boundary around the exposed sensor area 104. In other embodiments, the inner dam 110 is formed by depositing a bead of material about the exposed sensor area 104. In the embodiments using the bead of material, the material is deposited in a semi-fluid state and then rapidly solidifies or is actively cured to form the inner dam 110. In some embodiment, the inner dam 110 covers or encapsulates at least a portion of the bond wire 106.

Figure 8:
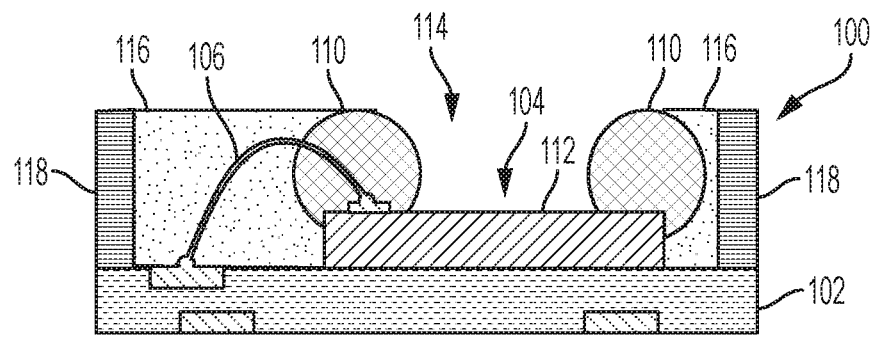

Referring now to FIG. 8, a first mold material 116 is deposited from a molding apparatus (not shown) into a volume defined between the inner dam 110 and an outer dam 118 that surrounds the inner dam 110 and at least the sensor device 100. In the embodiment shown in FIG. 8, the outer dam 118 is positioned on the substrate 102 prior to the deposition of the first mold material 116 into the volume 110, 118. The outer dam 118 is connected to the substrate 102 in any known manner that prevents the injected first mold material 116 from passing between the outer dam 118 and the substrate 102 during the molding process. In some embodiments, the outer dam 118 is bonded to the substrate 102 with an adhesive to form the seal therebetween. In other embodiments, the outer dam 118 is relatively loosely attached to the substrate 102 prior to the molding process, but during the molding process, a feature of the molding apparatus presses the outer dam 118 into the substrate 102 to form the seal therebetween.

In the embodiment shown, the first mold material 116 is a polymer compound having a first liquid or semi-liquid state and a second semi-solid or solid state. The first mold material 116 is deposited in its first liquid or semi-liquid state into the volume defined by the inner and the outer dams 110, 118. The first mold material 116 is deposited into the volume with material attributes that enable the first mold material 116 to substantially encapsulate the exposed features of the sensor device and the substrate within the volume. The exclusionary zone defined by inner dam 110 seals off the opening 114 to the exposed sensor area 104 during the molding process so that the first mold material 116 does not enter the opening 114 and obstruct the exposed sensor area 104.

Figure 9:
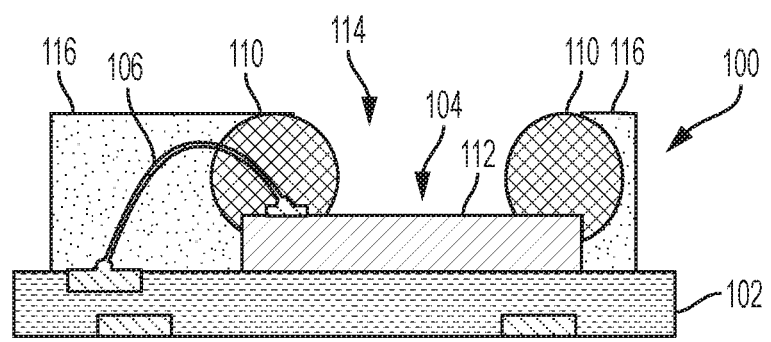

Referring now to FIG. 9, the first mold material 116 is cured at a temperature in a range from 120° C. to 250° C. until the material 116 transitions into its second solid or semi-solid state. Once cured, the first mold material 116 forms an exposed-die mold package that encapsulates the portions of the sensor device and associated components located between the inner and the outer dams 110, 118, but that leaves the exposed sensor area 104 of the sensor device 100 entirely unobstructed from first mold material 116. In some embodiments, the outer dam 118 is removable after the first mold material 116 cures. The outer dam 118 in other embodiments remains as an integral component of the mold package after the completion of the molding process and the curing of the first mold material 116.

The exposed-die mold package formed by the above-described process imparts no chemical or mechanical impact on the sensor device and has only limited temperature influence due to the curing of the first mold material. The opening 114 through the mold package provides the exposed sensor area with direct access to the environment to sense conditions such as the presence of media, ambient, or radiation. The bond wires and chip corners of the sensor device are protected within the mold package. The encapsulated sensor device provided according to the above-described process has a final package area in a range of 1 mm² to 6 mm² and a final package height in a range of 0.2 to 2 mm.

The position of the outer dam 118 used to form the exposed-die mold package can be adjusted to produce different exposed-die mold package configurations. By way of example, the outer dam 118 can be positioned locally around a sensor device, such as the pressure sensor 26 described above with reference to FIGS. 1 and 3, such that the mold package encapsulates only the portions of the sensor device between the inner and the outer dams 110, 118.

By way of another example, the outer dam 118 can be positioned locally around a pair of electronic chips on a substrate, such as the ASIC 24 and sensor device 100 described above with reference to FIGS. 1 and 4. In the embodiments with the outer dam 118 positioned locally around the pair of chips, the mold package substantially encapsulates the ASIC and the portions of the sensor device 100 between the inner and the outer dams 110, 118. The formation of the mold package locally around individual chip pairs on the substrate reduces the stress influence from the cured mold material on the substrate, thereby virtually eliminating substrate bow.

By way of yet another example, the outer dam 118 can be positioned regionally around a plurality of electronic chips on a substrate, such as the ASIC's 24 and the pressure sensors 26 described above with reference to FIGS. 1 and 5. In the embodiments with the outer dam 118 positioned regionally around multiple chip pairs, the mold package substantially encapsulates the entire area between the outer dam 118 and the plurality of inner dams 110 positioned on each of the pressure sensors 100 within the encapsulation area 73. The formation of the mold package regionally around the plurality of chip pairs allows for faster processing of the mold package, less overall topology, and simplified singulation of the respective chip pairs as discussed below with reference to FIGS. 14-16.

Figure 10:
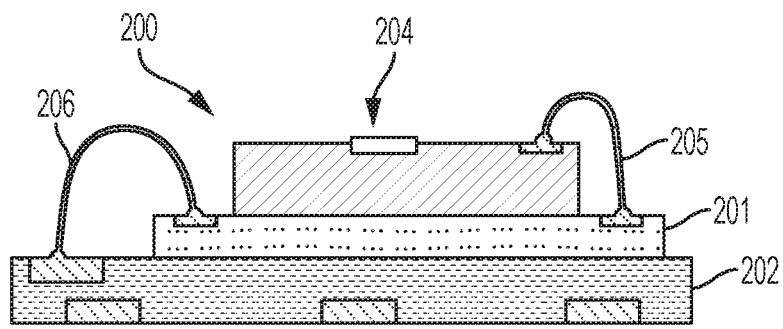
FIGS. 10-13 depict a second embodiment of a process for forming the mold package variants of FIGS. 1-5.

Referring now to FIGS. 10-13, a process for encapsulating a sensor device that interacts with the environment is depicted according to a second embodiment. Referring initially to FIG. 10, a sensor device 200 is provided on an intermediate layer 201, which in turn is provided on a substrate 202. In some embodiments, the intermediate layer 201 is an ASIC. Similar to the sensor device 100 of FIGS. 6-9, the sensor device 200 includes at least one exposed sensor area 204 formed in a silicon layer of the device 200. The exposed sensor area 204 is configured to directly interact with the environment to sense a condition of the environment. In the embodiment shown, a first bond wire 205 forms an electrical connection between the sensor device 200 and the intermediate layer 201, and a second bond wire 206 forms an electrical connection between the intermediate layer 201 and the substrate 202. In some embodiments, the sensor device 200 can include more or less than two bond wires that electrically connect the sensor device to the substrate and/or to other electronic components.

Figure 11:
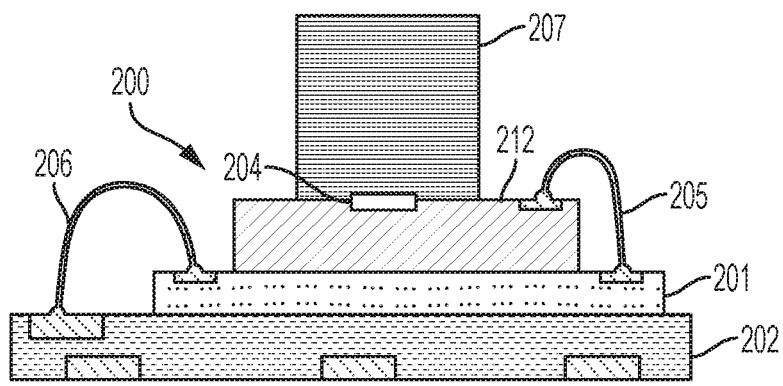

FIG. 11 shows an inner dam 207 positioned centrally above the exposed sensor area 204 of the sensor device 200. The inner dam 207 is positioned on the sensor device 100 in a manner that forms an exclusionary zone above the exposed sensor area 204 by the space occupied by the inner dam 207. The inner dam 207 is formed from a selectively removable material such as petroleum jelly, a thermal decomposable polymer, or the like. The term "selectively removable material" as used herein refers to a material that is (i) deposited on the sensor device 200 in a first processing step to provide an impervious or semi-impervious boundary to subsequently deposited material and (ii) removed or released entirely from the sensor device 200 in a second processing step.

Figure 12:
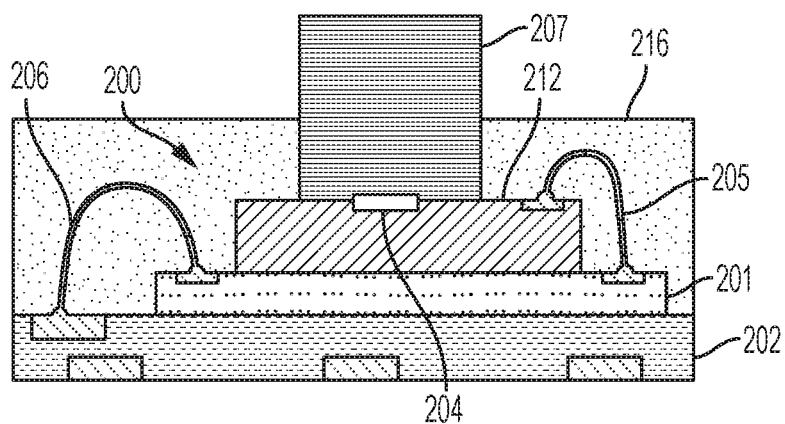

Referring now to FIG. 12, a second mold material 216 is deposited from a molding apparatus (not shown) into a volume defined between the inner dam 207 and an outer dam (e.g., outer dam 118 in FIG. 8) that surrounds the inner dam 207 and at least the sensor device 200. The outer dam in some embodiments is positioned on the substrate 202 in a manner similar to outer dam 118 described above with reference to FIG. 8.

In the embodiment shown, the second mold material 216 is a polymer compound having at least a third liquid or semi-liquid state and a fourth semi-solid or solid state. The second mold material 216 is deposited in its third liquid or semi-liquid state into the volume defined by the inner dam 207 and the outer dam. The second mold material 216 is deposited into the volume with material attributes that enable the second mold material 216 to substantially encapsulate the exposed features of the sensor device and the substrate within the volume. The mold material 216 is then cured at a temperature in a range from 120° C. to 250° C. until the material 216 transitions into its fourth solid or semi-solid state. As shown in FIG. 12, the inner dam 207 occupies the space above the exposed sensor area 204 and prevents the second mold material 216 from contacting the exposed sensor area 204 during the molding and the curing processes.

Figure 13:
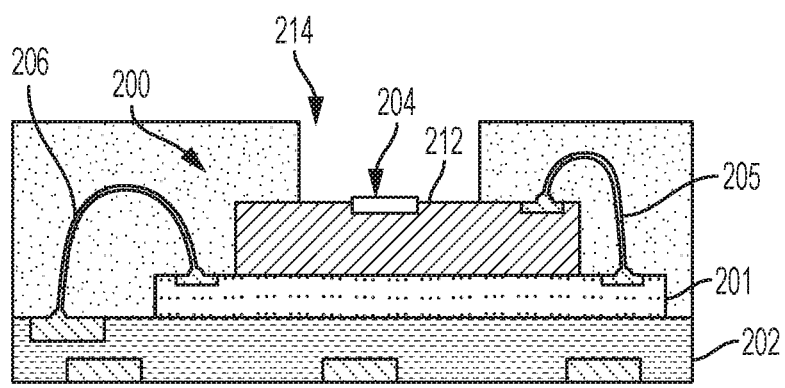

Referring now to FIG. 13, once the second mold material 216 is cured, the inner dam 207 (FIG. 12) is selectively removed to form an opening 214 through the cured second mold material 216 that exposes the exposed sensor area 204 to the environment. The inner dam 207 is removed by any process that selectively removes the material of the inner dam 207, but that does not change or degrade the cured second mold material 216 adjacent to the inner dam 207. Such removal processes can include one or more of chemical removal, thermal removal, plasma removal, and the like.

Figure 14:
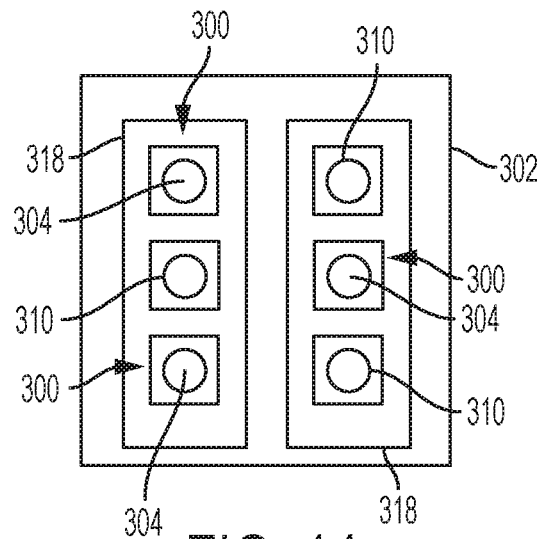
FIGS. 14-16 depict a process for singulating a plurality of encapsulated electronic chips from a substrate.
Figure 15:
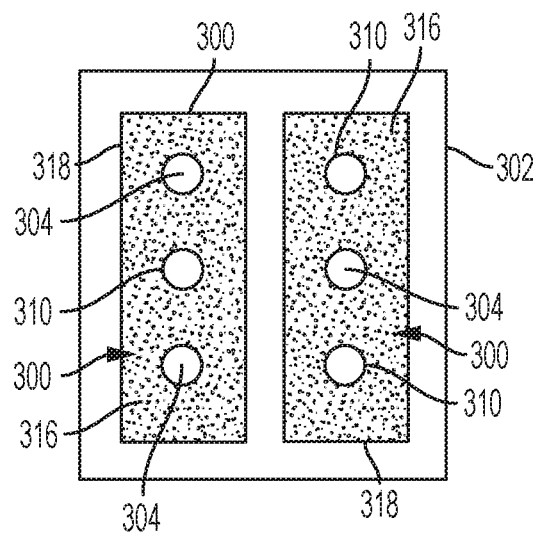
Figure 16:
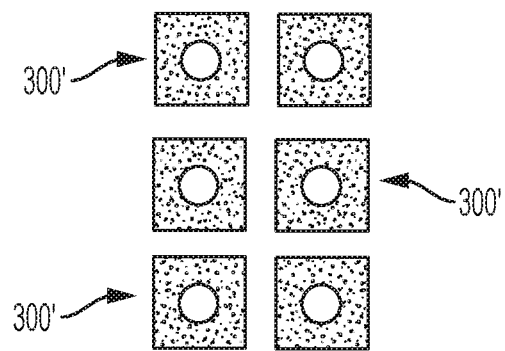

FIGS. 14-16 depict a process for forming a plurality of encapsulated sensor devices. Referring initially to FIG. 14, a plurality of electronic chips 300 are affixed to a substrate 302. In the embodiment shown, the chips 300 are sensor devices with respective exposed sensor areas 304 that directly interact with the environment to sense a condition of the environment. An inner dam 310 is positioned around (110 in FIG. 7) or above (207 in FIG. 11) each of the exposed sensor areas 304. A respective outer dam 318 is then formed around one or more groups of the chips 300 (e.g., outer dam 118 in FIG. 8). A third mold material 316 is then deposited between the inner dams 310 and the outer dam 318 of each chip group (FIG. 15). After the third mold material cures, the groups of encapsulated chips are singulated into a plurality of encapsulated chips 300' (FIG. 16).

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of encapsulating a sensor device in an exposed-die mold package, comprising:
    providing a first sensor on a substrate, the first sensor having a first upper surface with a first exposed sensor area defined in a portion of the first upper surface;

depositing a first dam on the first upper surface thereby forming a first exclusionary zone including the first exposed sensor area;

depositing first mold material onto the first sensor about the first exclusionary zone; and encapsulating the first sensor with the deposited first mold material such that one or more of the deposited first dam and the deposited first mold material defines a first opening that permanently fluidically connects the first exposed sensor area to an environment external to the sensor device, wherein no material contacts the first exposed sensor area or otherwise obstructs the first opening after the first sensor is encapsulated with the deposited first mold material.

2. The method of claim 1, further comprising:

removing the deposited first dam after encapsulating the first sensor.

3. The method of claim 1, further comprising:

forming a second dam spaced apart from and encircling the first dam, wherein depositing first mold material comprises:

depositing first mold material within a space between the first dam and the second dam.

4. The method of claim 1, further comprising:

providing a second sensor on the substrate, the second sensor having a second upper surface with a second exposed sensor area defined in a portion of the second upper surface;

depositing a second dam on the second upper surface thereby forming a second exclusionary zone including the second exposed sensor area;

depositing second mold material onto the second sensor about the second exclusionary zone; and encapsulating the second sensor with the deposited second mold material such that one or more of the deposited second dam and the deposited second mold material defines a second opening that permanently fluidically connects the second exposed sensor area to the environment.

5. The method of claim 4, further comprising:

forming a third dam spaced apart from and encircling only the first dam; and forming a fourth dam spaced apart from and encircling only the second dam, wherein depositing the first mold material comprises depositing the first mold material within a first space between the first dam and the third dam, and wherein depositing the second mold material comprises depositing the second mold material within a second space between the second dam and the fourth dam.

6. The method of claim 4, further comprising:

forming a third dam spaced apart from and encircling the first dam and the second dam.

7. The method of claim 1, wherein depositing the first dam comprises:

depositing the first dam such that the first dam encircles a portion of the first upper surface including the first exposed sensor area.

8. The method of claim 7, wherein depositing the first dam further comprises:

pressing an insert on the first sensor.

9. The method of claim 7, wherein depositing the first dam further comprises:

depositing a bead of material on the first sensor.

10. The method of claim 1, wherein:

the first sensor includes at least one bond wire electrically connecting the first sensor to the substrate, and the first dam is deposited such that the at least one bond wire is encapsulated by the deposited first mold material.

11. The method of claim 1, wherein:

depositing first mold material comprises depositing a polymer compound having a first liquid or semi-liquid state, and encapsulating the first sensor with the deposited first mold material comprises encapsulating the first sensor with the deposited polymer compound having a second semi-solid or solid state.

12. The method of claim 1, wherein:

providing the first sensor on the substrate comprises providing an application specific integrated circuit (ASIC) and the first sensor on the substrate, the ASIC operatively connected to the first sensor via at least one bond wire, and encapsulating the first sensor with the deposited first mold material comprises encapsulating the ASIC, the at least one bond wire, and the first sensor with the deposited first mold material.

13. A method of encapsulating a plurality of sensor devices in respective exposed-die mold packages, comprising:

providing a first sensor on a substrate, the first sensor having a first upper surface with a first exposed sensor area defined in a portion of the first upper surface;

providing a second sensor on the substrate, the second sensor having a second upper surface with a second exposed sensor area defined in a portion of the second upper surface;

depositing a first dam on the first upper surface thereby forming a first exclusionary zone including the first exposed sensor area;

depositing a second dam on the second upper surface thereby forming a second exclusionary zone including the second exposed sensor area;

depositing mold material onto (i) the first sensor about the first exclusionary zone and (ii) the second sensor about the second exclusionary zone; and encapsulating the first sensor and the second sensor with the deposited mold material, the first sensor encapsulated such that one or more of the deposited first dam and the deposited mold material defines a first opening that fluidically connects the first exposed sensor area to an environment external to the sensor device.

14. The method of claim 13, further comprising:

singulating the encapsulated first and second sensors such that the first sensor is associated with a singulated first portion of the substrate and the second sensor is associated with a singulated second portion of the substrate.

* * * * *